United States Patent
Chang et al.

(10) Patent No.: US 7,911,798 B2
(45) Date of Patent: Mar. 22, 2011

(54) MEMORY HEAT SINK DEVICE PROVIDED WITH A LARGER HEAT DISSIPATING AREA

(76) Inventors: Chih-I Chang, Taipei County (TW); Chih-Chieh Chang, Taipei County (TW)

( * ) Notice: Subject to any disclaimer, the term of this patent is extended or adjusted under 35 U.S.C. 154(b) by 86 days.

(21) Appl. No.: 12/260,094

(22) Filed: Oct. 29, 2008

(65) Prior Publication Data

US 2009/0122481 A1    May 14, 2009

(51) Int. Cl.
*H05K 7/20* (2006.01)
*H01L 23/36* (2006.01)

(52) U.S. Cl. ........ 361/719; 361/702; 361/707; 361/709; 361/715; 361/679.54; 257/709; 257/719

(58) Field of Classification Search ............... 361/707, 361/709, 715, 719, 728, 737, 702, 679.54; 257/709, 719
See application file for complete search history.

(56) References Cited

U.S. PATENT DOCUMENTS

| | | | | |
|---|---|---|---|---|
| 5,109,318 | A * | 4/1992 | Funari et al. | 361/710 |
| 5,966,287 | A * | 10/1999 | Lofland et al. | 361/704 |
| 6,088,228 | A * | 7/2000 | Petersen et al. | 361/720 |
| 6,119,765 | A * | 9/2000 | Lee | 165/80.3 |
| 6,233,150 | B1 * | 5/2001 | Lin et al. | 361/704 |
| 6,297,961 | B1 * | 10/2001 | Koizumi et al. | 361/720 |
| 6,297,966 | B1 * | 10/2001 | Lee et al. | 361/799 |
| 6,765,797 | B2 * | 7/2004 | Summers et al. | 361/704 |
| 6,775,139 | B2 * | 8/2004 | Hsueh | 361/697 |
| 6,888,719 | B1 * | 5/2005 | Janzen et al. | 361/679.31 |
| 7,079,396 | B2 * | 7/2006 | Gates et al. | 361/719 |
| 7,106,595 | B2 * | 9/2006 | Foster et al. | 361/721 |
| 7,187,552 | B1 * | 3/2007 | Stewart et al. | 361/704 |
| 7,215,551 | B2 * | 5/2007 | Wang et al. | 361/707 |
| 7,289,327 | B2 * | 10/2007 | Goodwin et al. | 361/701 |
| 7,333,338 | B2 * | 2/2008 | Lai et al. | 361/715 |
| 7,345,882 | B2 * | 3/2008 | Lee et al. | 361/710 |
| 7,349,219 | B2 * | 3/2008 | Lai et al. | 361/719 |
| 7,349,220 | B2 * | 3/2008 | Lai et al. | 361/719 |
| 7,375,964 | B2 * | 5/2008 | Lai et al. | 361/704 |
| 7,391,613 | B2 * | 6/2008 | Lai et al. | 361/700 |
| 7,443,023 | B2 * | 10/2008 | Wehrly et al. | 257/707 |
| 7,457,122 | B2 * | 11/2008 | Lai et al. | 361/704 |
| 7,542,297 | B2 * | 6/2009 | Wehrly et al. | 361/749 |
| 7,600,557 | B2 * | 10/2009 | Chiang et al. | 165/80.2 |
| 7,609,523 | B1 * | 10/2009 | Ni et al. | 361/715 |
| 2002/0039282 | A1 * | 4/2002 | Han et al. | 361/719 |
| 2004/0130873 | A1 * | 7/2004 | Hsueh | 361/697 |
| 2004/0250989 | A1 * | 12/2004 | Im et al. | 165/80.1 |
| 2005/0141199 | A1 * | 6/2005 | Chiou et al. | 361/704 |
| 2005/0201063 | A1 * | 9/2005 | Lee et al. | 361/715 |
| 2006/0203454 | A1 * | 9/2006 | Chang | 361/707 |
| 2006/0268523 | A1 * | 11/2006 | Lin | 361/710 |
| 2007/0195489 | A1 * | 8/2007 | Lai et al. | 361/600 |
| 2007/0223198 | A1 * | 9/2007 | Lai et al. | 361/720 |
| 2007/0263360 | A1 * | 11/2007 | Lai et al. | 361/719 |
| 2008/0013282 | A1 * | 1/2008 | Hoss et al. | 361/715 |
| 2008/0101036 | A1 * | 5/2008 | Chen | 361/720 |
| 2009/0103269 | A1 * | 4/2009 | Liu et al. | 361/719 |
| 2009/0129026 | A1 * | 5/2009 | Baek et al. | 361/710 |
| 2009/0268408 | A1 * | 10/2009 | Liu et al. | 361/710 |

* cited by examiner

*Primary Examiner* — Anatoly Vortman (57) ABSTRACT

A memory heat sink device having an enlarged heat dissipating area is provided. The memory heat sink device includes two cooling fins that are respectively attached to a front side and a back side of a memory. Raised dots are protruded from a front (or back) side of the cooling fin attached to the front (or back) side of the memory. Each of the raised dots on the cooling fin has at least one sectional area and at least one connection portion. Thus, the heat sink area of the cooling fin increases and heat generated by the memory is easily dissipated by the sectional area through thermal convection.

3 Claims, 10 Drawing Sheets

MEMORY HEAT SINK DEVICE PROVIDED WITH A LARGER HEAT DISSIPATING AREA

BACKGROUND OF THE INVENTION

1. Field of the Invention

This invention relates to a memory heat sink device having an enlarged heat dissipating area and, more particularly, to a heat sink device including a cooling fin on which a plurality of raised dots is formed.

2. Description of the Related Art

The operation speeds of computers become faster and faster day by day and thus memory devices generate more and more heat. If the heat so generated cannot be dissipated effectively, computers may easily breakdown. Thus, the front and back sides of a memory are adhered with cooling fins opposite to each other, so as to enhance heat dissipation. This has almost become a standardized arrangement for all computer memories.

There are several references that disclose a memory heat sink device having two heat sink fins installed on the memory heat sink device. However, the disclosure of those references focus primarily on the buckling of two heat sink fins, or on a heat sink device having an upward stretching structure.

In most of those references, the heat sink device is provided with planar metal cooling fins so as to dissipate heat by conduction. Those references also disclose a structure that can conduct heat with higher efficiency or a structure that has an increased heat dissipation area.

For example, in Taiwan Patent No. M279165, entitled "IMPROVED MEMORY COOLING FIN," the outside surfaces of two clips are formed with special convex and concave lines that are alternately arranged for increasing heat dissipation areas. However, the cooling fin dissipates heat by conduction.

For example, in Taiwan Patent No. M292738, entitled "HEAT SINK STRUCTURE OF A MEMORY CHIP," one of two sides of a heat-dissipating plate contacting with a memory is formed with at least one protruding portion for increasing the heat dissipation area. However, the cooling fin dissipates heat by conduction.

For example, in Taiwan Patent No. M298165, entitled "HEAT SINK STRUCTURE OF A MEMORY," a plurality of fins are formed at two outer sides of a receptacle (the cooling fin) corresponding to a cross portion. However, the cooling fin dissipates heat by conduction.

For example, in Taiwan Patent No. M303419, entitled "HEAT SINK DEVICE FOR A MEMORY," which discloses a device that dissipates heat by thermal convection, a plurality of heat dissipation vents are formed on the surfaces of two cooling fins. Although the effect of thermal convection increases in such a design, the heat dissipation vents would inevitably take up some space in the fin such that the area of cooling fin decreases and dust may easily accumulate on the heat dissipation vents. Accordingly, there are still many drawbacks for heat sink devices using thermal convection.

SUMMARY OF THE INVENTION

To solve the above mentioned drawbacks, a memory heat sink having an enlarged heat dissipating area according to one embodiment of this invention is provided. The heat sink device comprises two cooling fins that are respectively attached to the front and back sides of a memory. A plurality of raised dots protrudes from the front side of the cooling fin attached to the front side of the memory. Each of the raised dots on the cooling fin has at least one sectional area and at least one connection portion. Thus, the heat sink area of cooling fin increases, and the sectional area is used to easily dissipate heat generated by the memory through thermal convection. Further, the raised dots increase the heat sink area on the cooling fin, and thus no large gap is formed and the dust may not easily accumulate.

In the memory heat sink device having an enlarged heat dissipating area according to one embodiment of this invention, the plurality of raised dots may be formed into arc-shaped sectional area and the connection portions of the raised dots may be vertical or horizontal.

In the memory heat sink device having an enlarged heat dissipating area according to one embodiment of this invention, the plurality of raised dots may be formed into two or more sectional areas. The symmetrical connection portions of the sectional areas may render the raised dots to have an arc shape.

In the memory heat sink device having an enlarged heat dissipating area according to one embodiment of this invention, the upper edge of the cooling fins may be formed with a tenon and a buckle.

DETAILED DESCRIPTION OF THE PREFERRED EMBODIMENTS

Now, embodiments of the present invention will be described in detail with reference to the accompanying drawings. It is to be noted that the following descriptions are presented for purpose of illustration and description only. It is not intended to be exhaustive or to be limited to the precise form disclosed.

Figure 1:
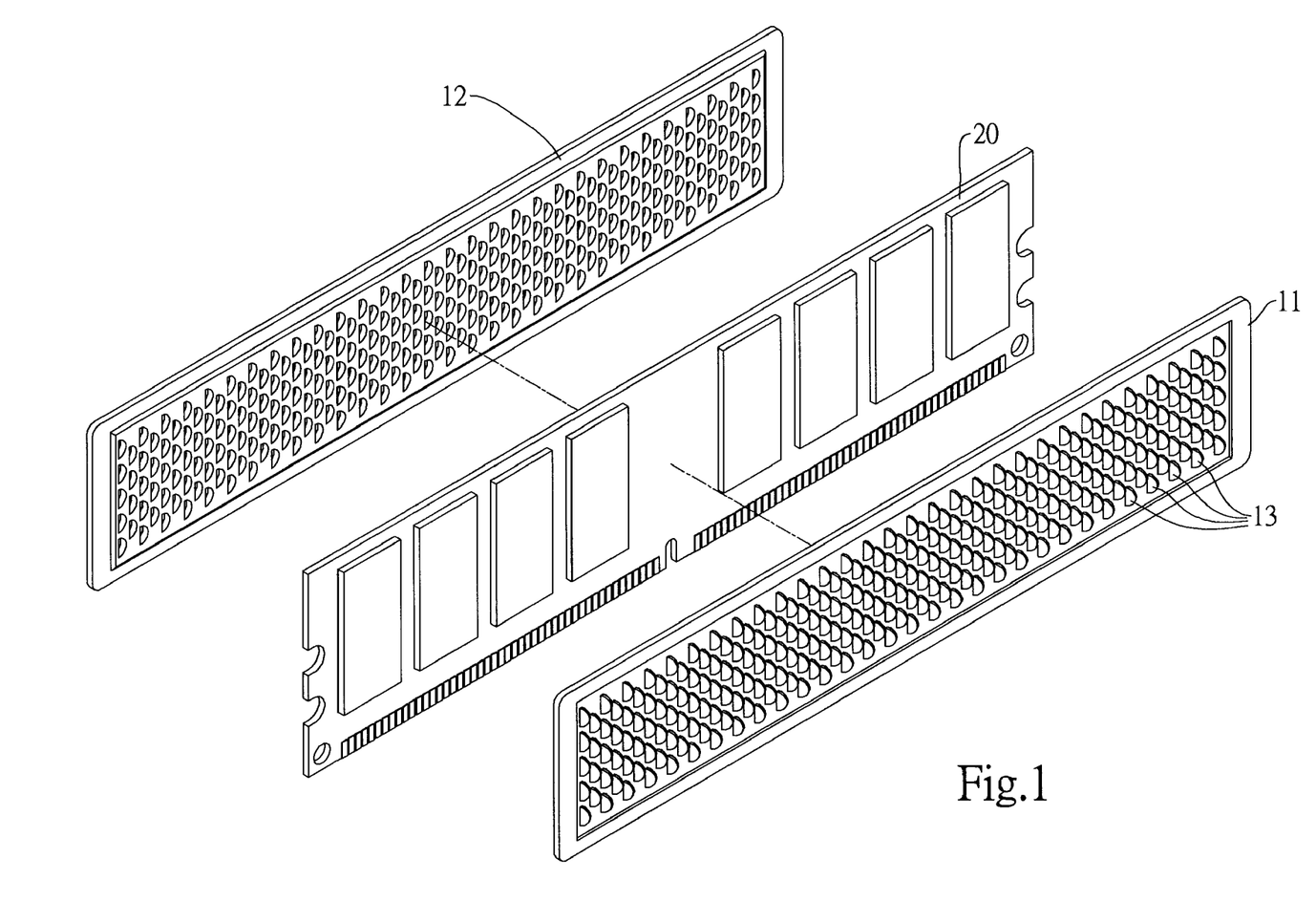
FIG. 1 is an exploded view of a first embodiment of this invention.
Figure 2:
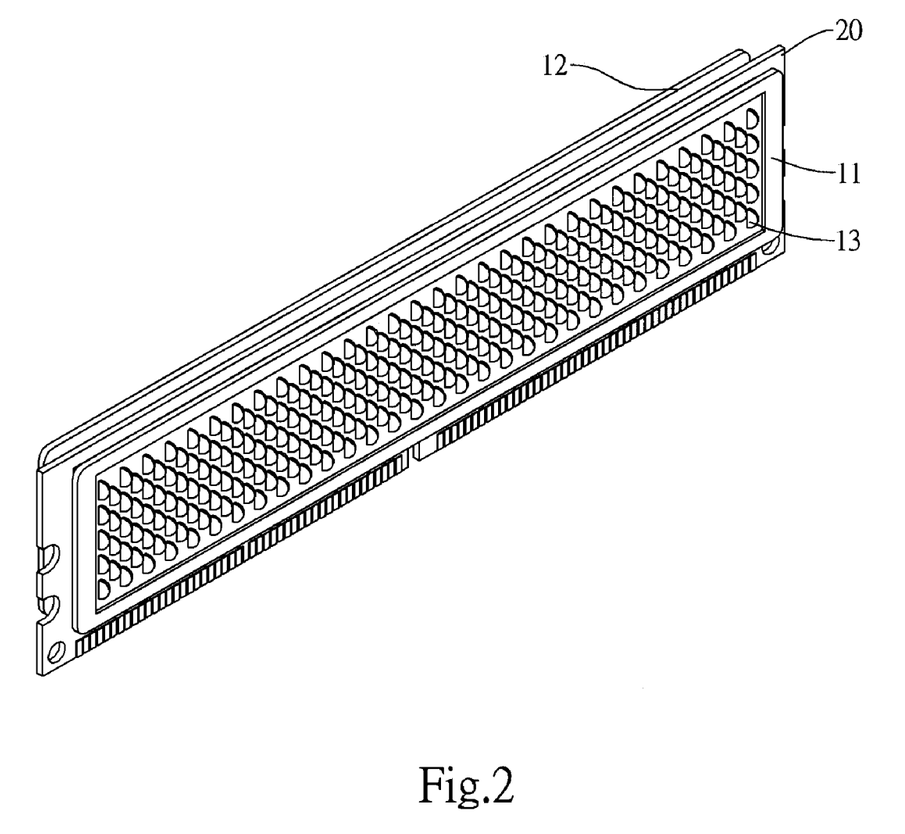
FIG. 2 is an assembly view of the structure illustrated in FIG. 1.

With reference to FIGS. 1 and 2, there is illustrated a memory heat sink device having an enlarged heat sink area according to a first embodiment of this invention. The memory heat sink device comprises two cooling fins 11 and 12 that are respectively attached to the front and back sides of a memory 20. The cooling fins 11 and 12 may be adhered to the memory 20 by using glue. In the present invention, a plurality of raised dots 13 are protruded from the front side of the cooling fin 11 attached to the front side of the memory. A plurality of raised dots 13 that protrude toward the back side may also be formed on the cooling fin 12 attached to the back side of the memory.

Figure 3:
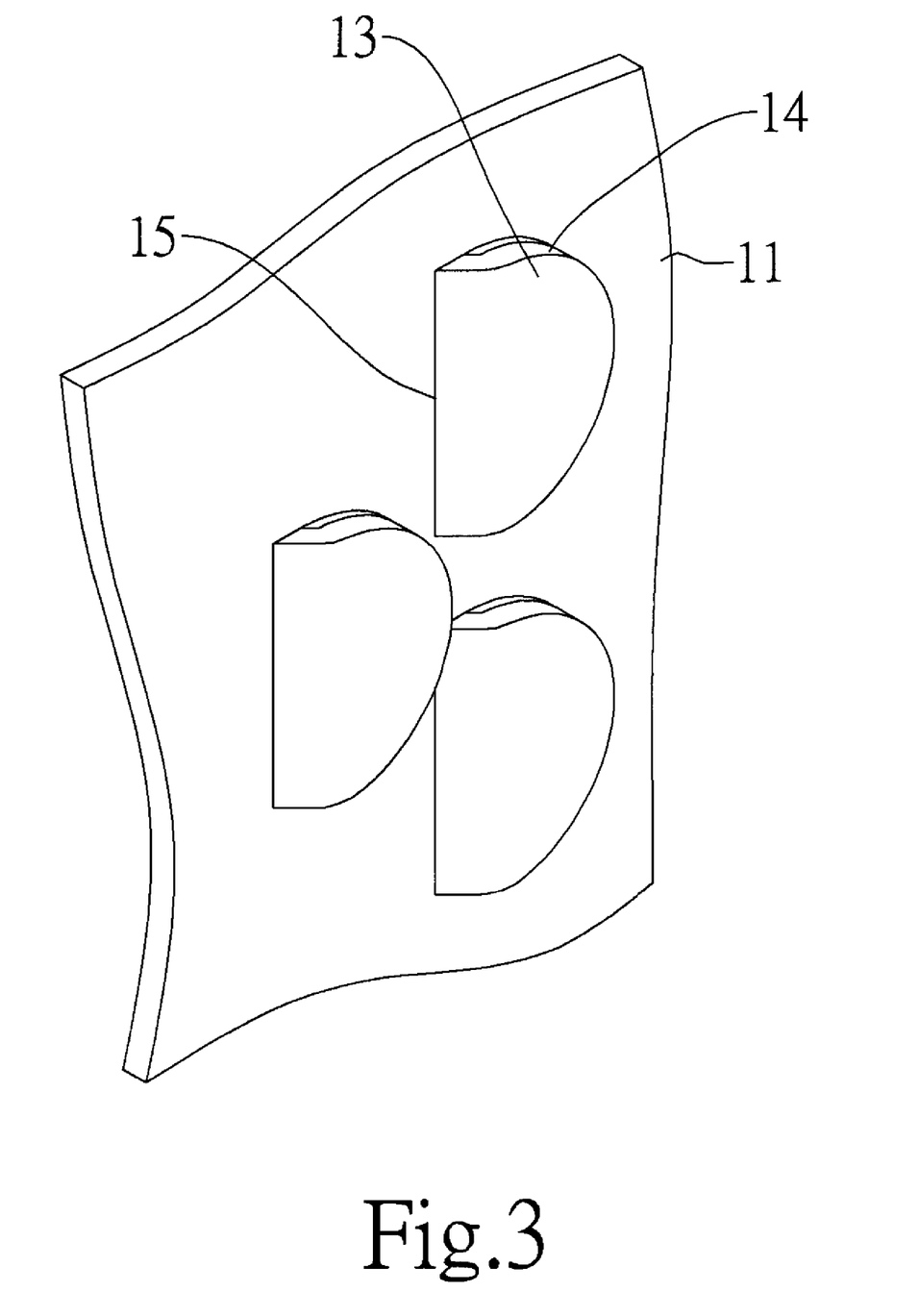
FIG. 3 is an enlarged view of raised dots shown in FIG. 1.
Figure 4:
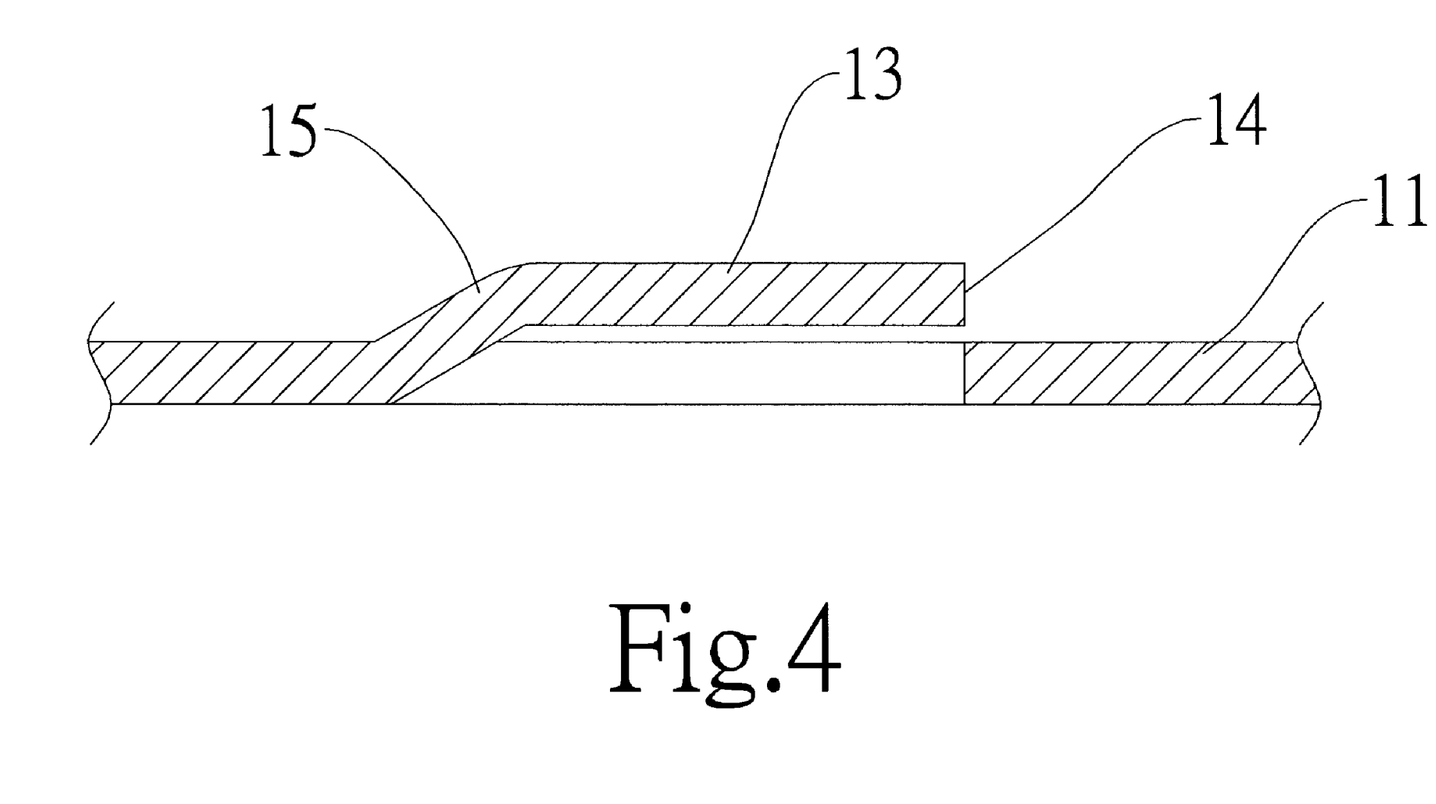
FIG. 4 is a sectional view of the raised dots shown in FIG. 1.

With reference to FIGS. 3 and 4, each of the raised dots 13 on the cooling fin 11 has at least one sectional area 14 and at least one connection portion 15. In the embodiment, each of the raised dots 13 is formed with an arc-shaped sectional area 14; and the connection portion 15 of the raised dot 13 is vertical to the memory device, thereby forming a fish scale shape.

In this embodiment, the raised dots 13 are used to increase the total thermal conduction area of cooling fin 11. In addition, a gap caused by the sectional area 14 is used to dissipate heat by thermal convection. Thus, better heat dissipation may be achieved. Further, because the gap between the raised dot 13 and the cooling fin 11 is small, no dust may accumulate.

Figure 5:
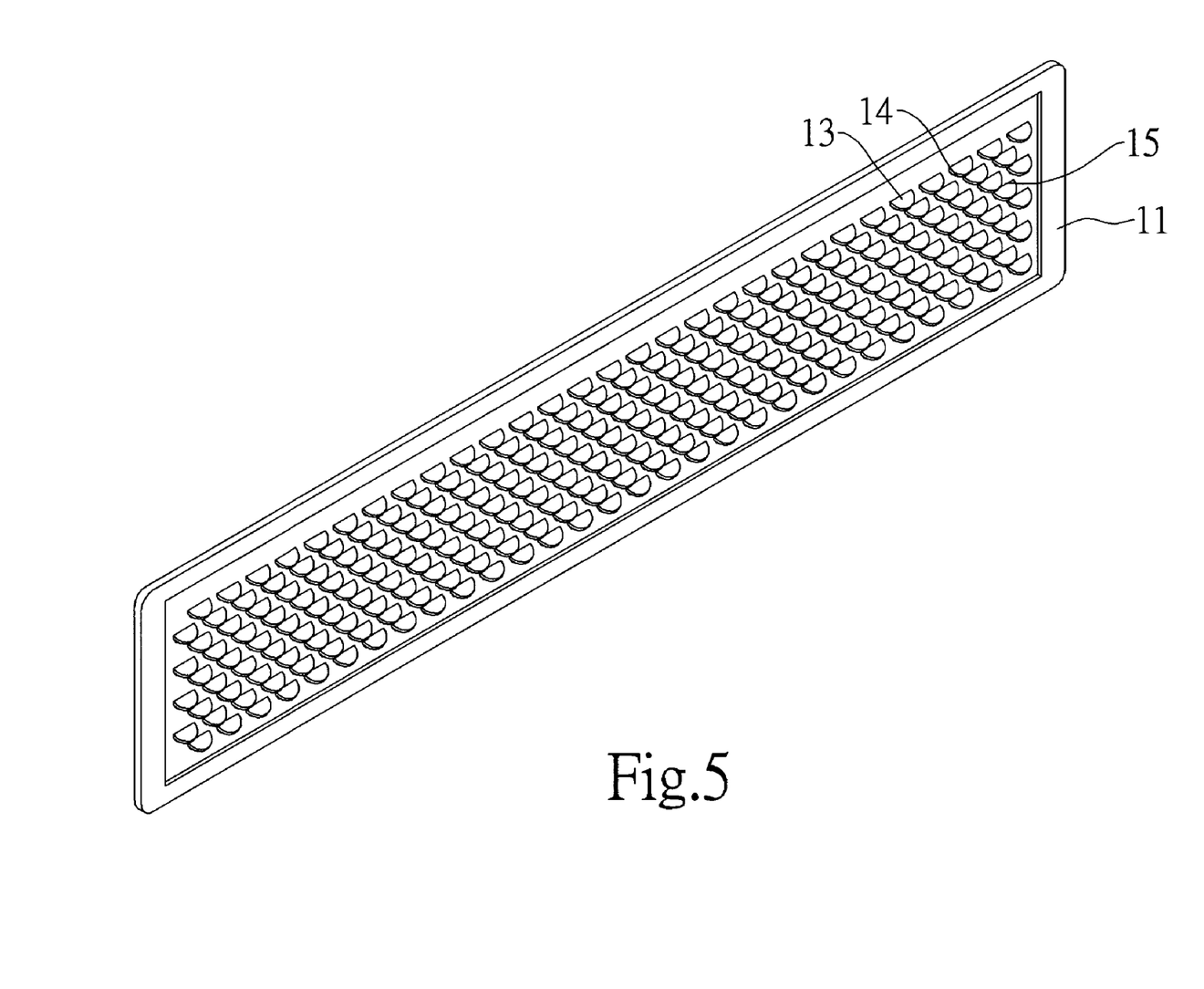
FIG. 5 is an assembly view of a second embodiment of this invention.

FIG. 5 shows a second embodiment of the present invention. The second embodiment is similar to the first embodiment in that the sectional area 14 of raised dot 13 has an arc shape. However, the second embodiment differs from the first embodiment in that the connection portion 15 is horizontally arranged.

Figure 6:
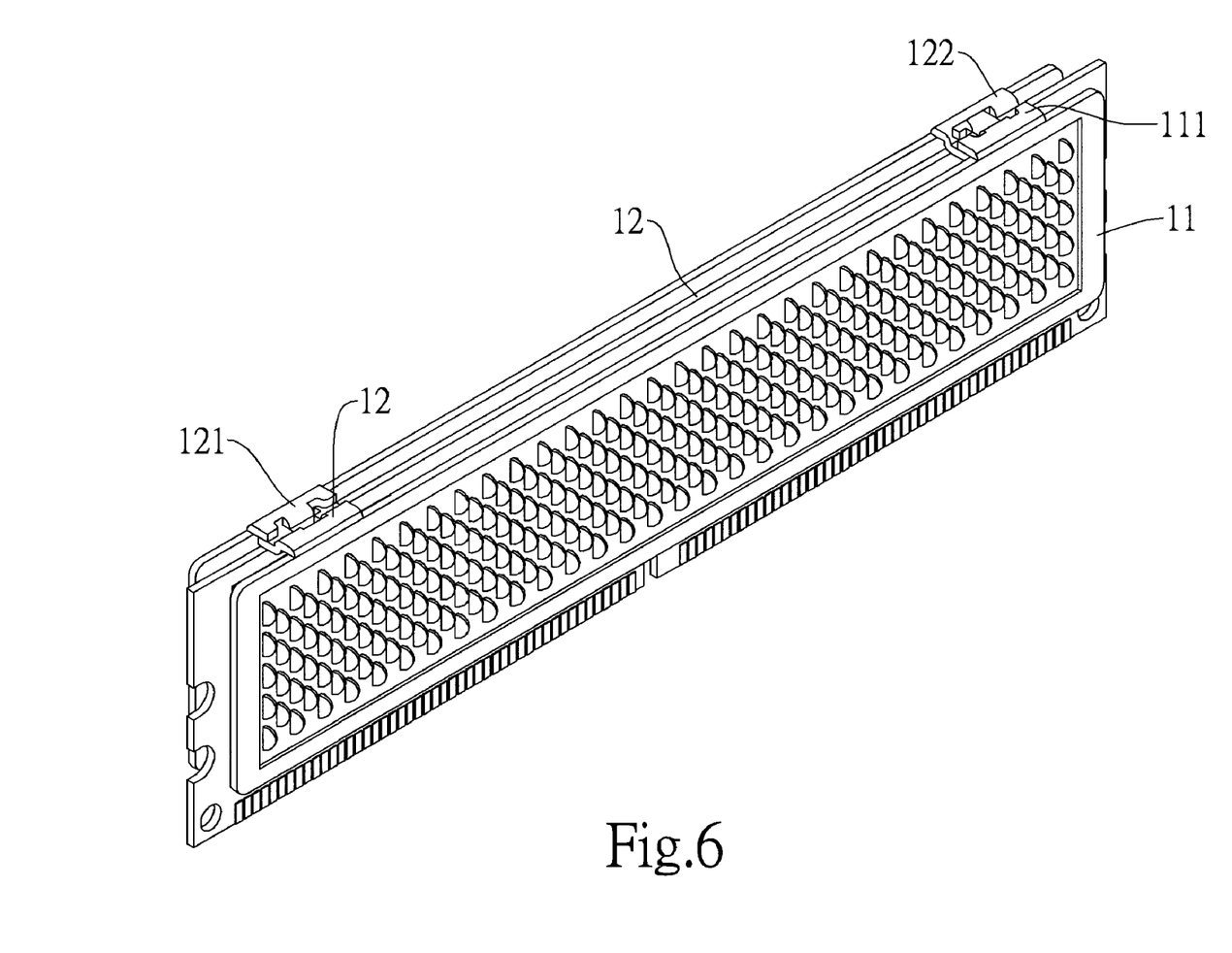
FIG. 6 is a partially exploded view of a third embodiment of this invention.

FIG. 6 shows a third embodiment of the present invention. The third embodiment is similar to the former embodiments. However, tenons 111 and 121 and clamp anchors 112 and 122 are provided corresponding to the upper edges of two cooling fins 11 and 12. The tenons 111 and 121 and the clamp anchors 112 and 122 may be wedged to each other. This embodiment may be applicable to the former embodiments.

Figure 7:
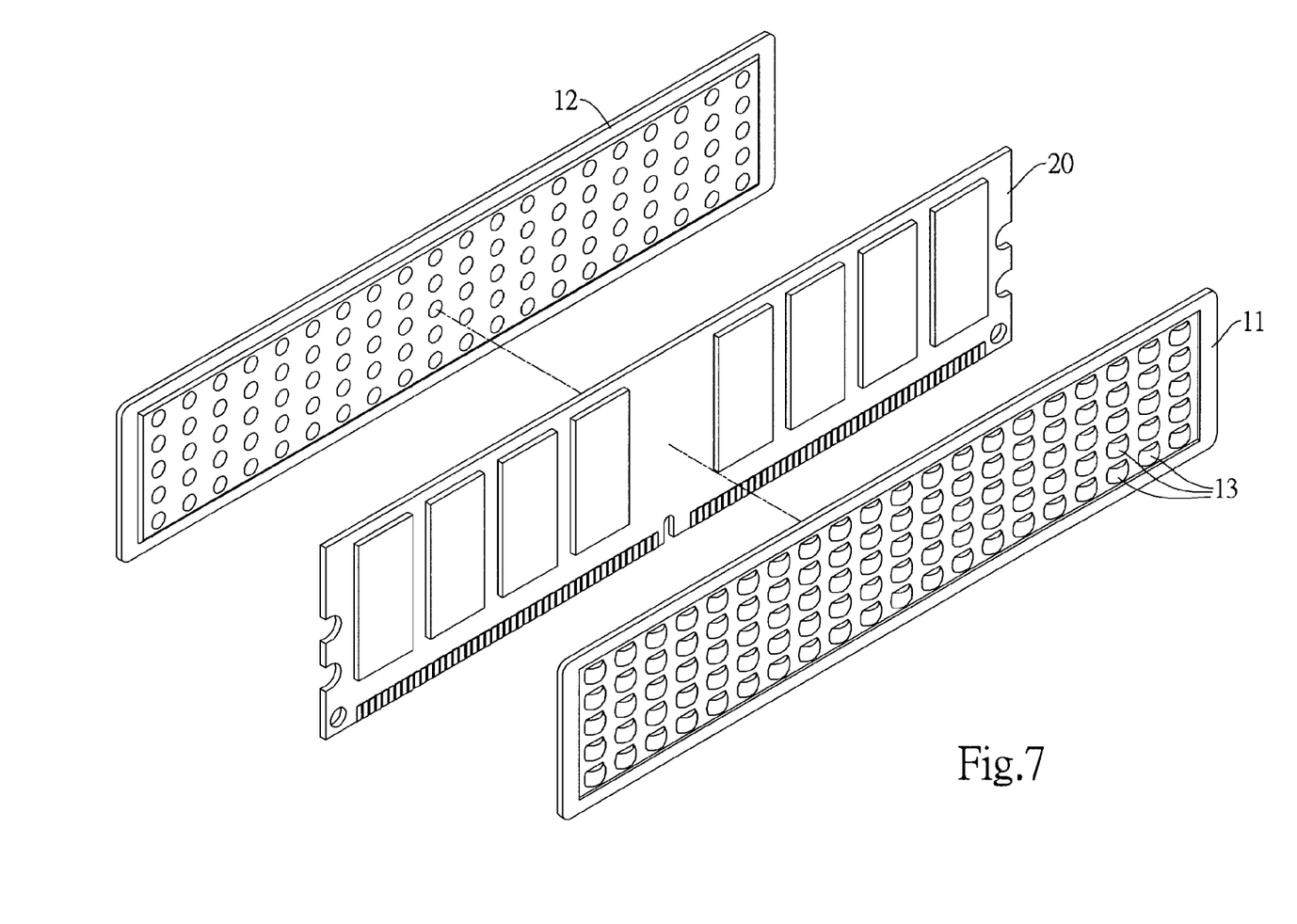
FIG. 7 is an exploded view of a fourth embodiment of this invention.
Figure 8:
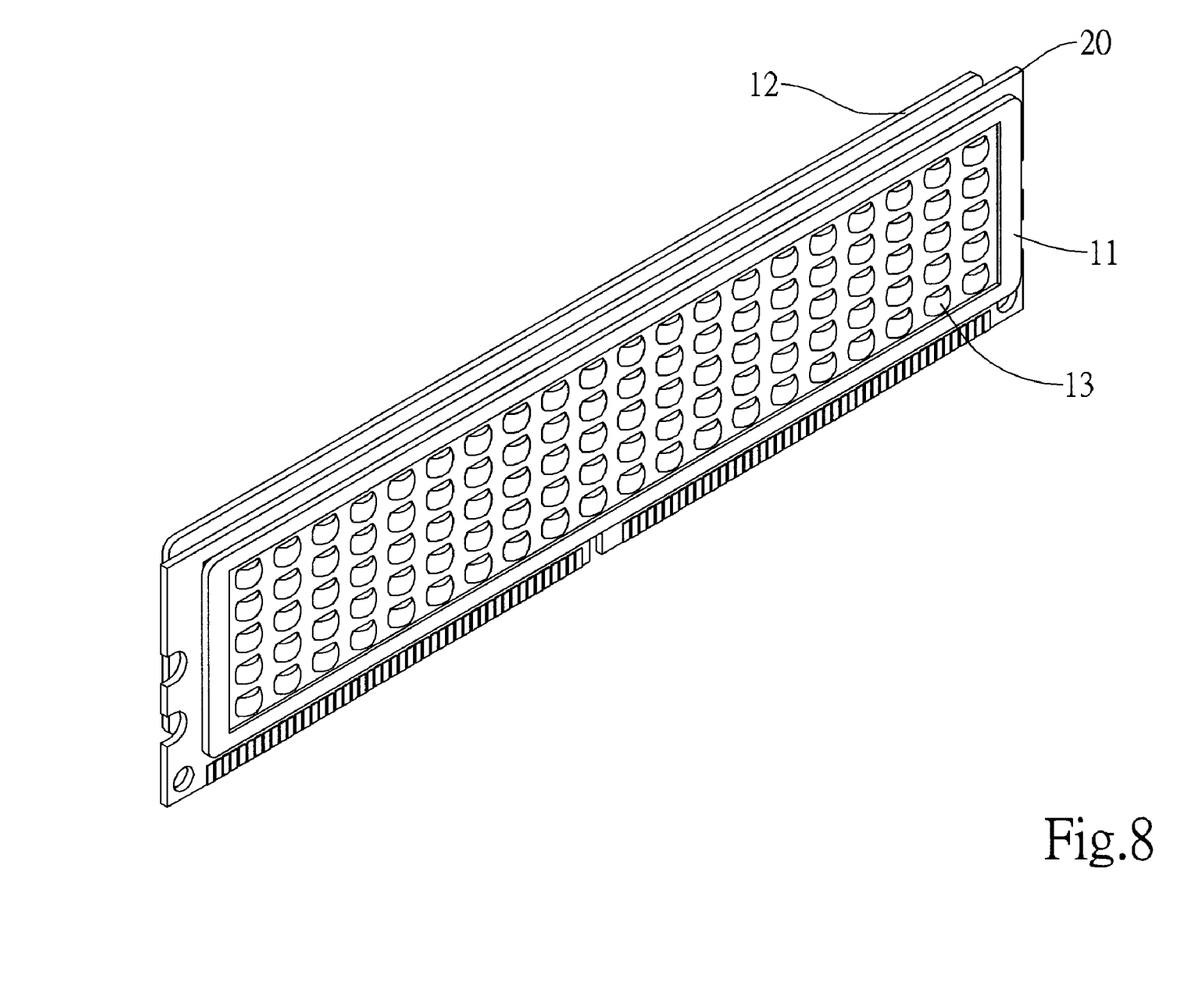
FIG. 8 is an assembly view of FIG. 7.
Figure 9:
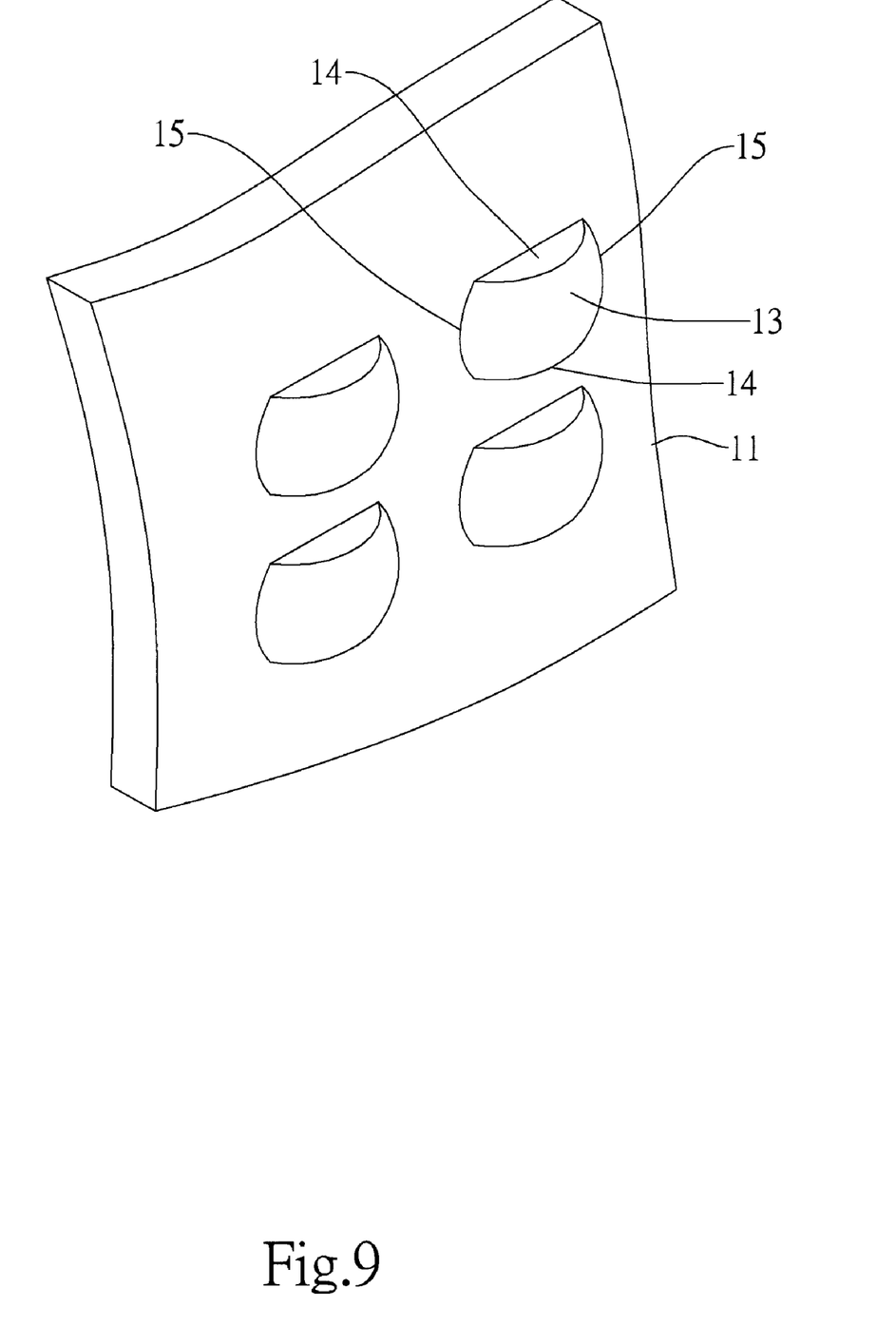
FIG. 9 is an enlarged view of the raised dots shown in FIG. 7.
Figure 10:
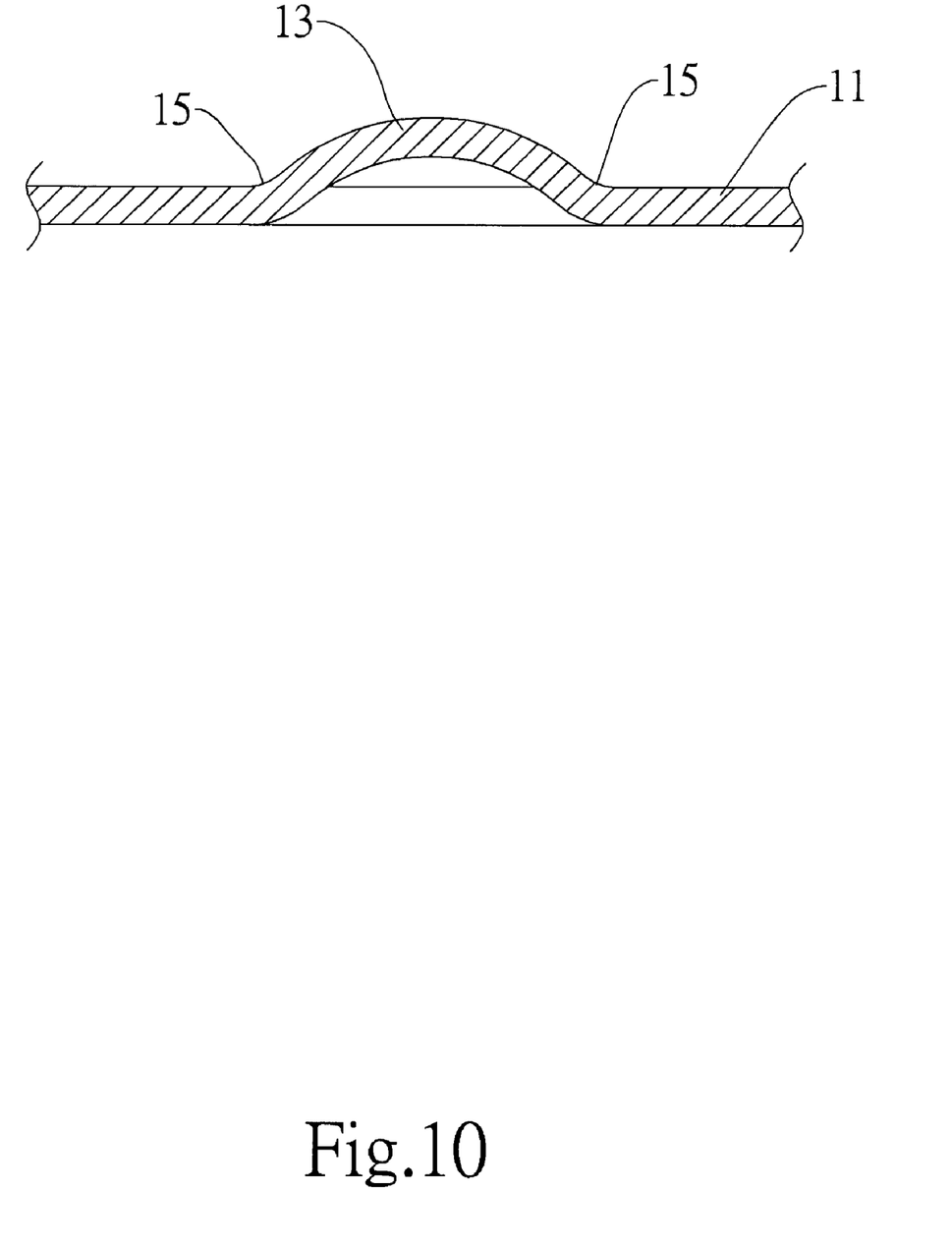
FIG. 10 is a sectional view of the raised dots shown in FIG. 7.

Further, the raised dots 13 may have another shape. For example, FIGS. 7 and 8 illustrate a fourth embodiment of the present invention. In this embodiment, two cooling fins 11 and 12 are respectively attached to the front and back sides of a memory 20 so as to form a heat sink device. With reference to FIGS. 9 and 10, the raised dot 13 is formed with two sectional areas 14 parallel to each other and two connection portions 15 symmetrical to each other. That is, the raised dot 13 is formed as an arc protrusion.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

The invention claimed is:

1. A memory heat sink device having an enlarged heat dissipating area, comprising:
    two cooling fins that are respectively attached to a front side and a back side of a memory; and
    a plurality of raised dots protruding from a front side of the cooling fin attached to the front side of the memory, and each of the raised dots on the cooling fin having at least one sectional area and at least one connection portion; wherein
    each of the raised dots is formed with two sectional areas parallel to each other and two connection portions symmetrical to each other; and
    each of the connection portions has an arc shape.

2. The memory heat sink device according to claim 1, wherein the two parallel sectional areas are horizontal.

3. The memory heat sink device according to claim 1, wherein tenons and clamp anchors are provided corresponding to the upper fringes of two cooling fins and the tenons and the clamp anchors are wedged to each other.

* * * * *